United States Patent [19]

Kawashima et al.

[11] 4,248,727

[45] Feb. 3, 1981

[54] DIELECTRIC CERAMICS

[75] Inventors: Syunichiro Kawashima, Nishinomiya; Masamitsu Nishida; Ichiro Ueda, both of Osaka; Hiromu Ouchi, Toyonaka, all of Japan

[73] Assignee: Matsushita Electric Industrial Co., Ltd., Japan

[21] Appl. No.: 99,724

[22] Filed: Dec. 4, 1979

[30] Foreign Application Priority Data

Dec. 4, 1978 [JP] Japan .................................. 53-150230
Dec. 4, 1978 [JP] Japan .................................. 53-150231

[51] Int. Cl.³ .............................................. H01B 3/12
[52] U.S. Cl. ..................................... 106/46; 106/39.5; 333/234
[58] Field of Search .......................... 252/63.5, 63.2; 333/234, 219, 229; 106/46, 39.5; 423/593

[56] References Cited

U.S. PATENT DOCUMENTS 3,696,314   10/1972   Kell et al. ........................... 106/46 X
3,708,315   1/1973    Matsuo et al. ................... 252/63.5 X

*Primary Examiner*—Helen M. McCarthy
*Attorney, Agent, or Firm*—Wenderoth, Lind & Ponack

[57] ABSTRACT

A dielectric ceramic having a composition expressible by $(1-w)(xBaO \cdot yNa_2O \cdot zNb_2O_5) + wMeO \cdot ZrO_2$ wherein Me denotes Ca or Sr, $0.593 \leq x \leq 0.762$, $0.04 \leq y \leq 0.13$, $0.174 \leq z \leq 0.32$, $x+y-z=1$, and $0 < w \leq 0.95$. It exhibits large dielectric constant and low microwave loss with high temperature-stability for resonant frequency and is suitable for use as dielectric resonators, electrical filters, substrates, etc.

1 Claim, No Drawings

DIELECTRIC CERAMICS

BACKGROUND OF THE INVENTION

The present invention relates to a dielectric ceramics and more particularly relates to such ceramics having high dielectric constant, high unloaded Q value and high stability against temperature variations so as to be advantageous to use in microwave circuits.

Conventionally, in the microwave frequency ranges, dielectrics have been applied for impedance matching in the microwave circuits and producing dielectric resonators, etc. Particularly, with the recent progress in the technique for integration of microwave circuits, there has been a strong demand for small-sized dielectric resonators as oscillator frequency stabilizers, frequency filters, etc., and therefore for materials having high dielectric constant and low microwave loss with sufficient stability against temperature variations, to be used, for example, as substrates for integrated circuits.

As material for dielectric resonators, various compositions, for example, compositions of the $BaO-TiO_2$ group, compositions prepared by substituting other elements for part of $BaO-TiO_2$ group, or compositions prepared by combining $TiO_2$ whose dielectric constant has negative temperature variation rate, with dielectric compositions whose dielectric constant has a positive temperature coefficient, have been mainly employed. Those compositions, however, are still unsatisfactory from a practical standpoint because they have such drawbacks as large dielectric loss, large temperature variations with respect to the dielectric constant, large deviations in the temperature variation rate of the dielectric constant, etc.

As an improved material for the above-mentioned purpose, we previously invented ceramics having the composition $xBaO.yNa_2.zNb_2O_5$ wherein $0.593 \leq x \leq 0.762$, $0.04 \leq y \leq 0.13$, $0.174 \leq z \leq 0.32$, and $x+y+z=1$, which can be employed to produce superior dielectric microwave resonators. However these ceramics are still unsatisfactory because of low stability against temperature variations.

SUMMARY OF THE INVENTION

It is an object of the invention to provide a dielectric ceramics for use in electrical and electronic equipment, which has large dielectric constant, and small microwave loss, with stability against temperature variations being sufficient.

In accomplishing these and other objects, a ceramics according to the present invention has a composition of $[(1-w) (xBaO.yNa_2O.zNb_2O_5)+wSrO.ZrO_2]$ or $[(1-w) xBaO.yNa_2O.zNb_2O_5+wCaO.ZrO_2]$, wherein $0.593 \leq x \leq 0.762$, $0.04 \leq y \leq 0.13$, $0.174 \leq z \leq 0.32$, $x+y+z=1$, and $0<w \leq 0.95$.

DETAILED DESCRIPTION OF THE INVENTION

Through various experiments, the present inventors have found that compositions prepared from a proper combination of BaO, $Nb_2O_5$, $Na_2O$, $ZrO_2$, CaO and SrO and sintered into dense ceramics have a high unloaded Q value and good stability with respect to temperature variations in the microwave frequencies. By properly altering the compositions, ceramics for use in the microwave frequency range having superior characteristics of relative dielectric constants of 28 to 40, Q values of 2700 to 4500 and temperature coefficient of resonant frequency of $+63$ to $-43$ ppm/°C. can be obtained.

As a result of measurement of electrical characteristics in the microwave frequency range, it has been found that the preferred composition is expressible by formula $(1-w) (xBaO.yNa_2O.zNb_2O_5)+wMeO.ZrO_2$ wherein Me denotes Ca or Sr.

The measurement of dielectric characteristics of the ceramics was performed as follows:

The dielectric constant ($\epsilon$) was determined from the specimen size and the resonant frequency (approximately 11 GHz). The resonant frequency and unloaded Q value ($Q_u$) were measured by reflectmeter system wherein the specimen of the ceramics was used as a microwave resonator. The temperature stability for the resonant frequency ($\tau_f$) was obtained from variation of the resonant frequency at temperatures between $-30°$ C. to $+70°$ C. The loss is represented by $1/Q$ from the unloaded Q value.

EXAMPLE 1

Starting materials of $BaCO_3$, $Na_2O$, $Nb_2O_5$, $SrCO_3$ and $ZrO_2$ were weighed according to the composition of $[(1-w) (xBaO.yNa_2O.zNb_2O_5)+wSrO.ZrO_2]$, and wet-mixed with the use of distilled water. The mixtures were dried and then calcined for 5 hours at a temperature of 1200° C. The calcined materials were wet-ground in a ball mill, dried and then molded into discs having a diameter of 25 mm under the pressure of 700 Kg/cm$^2$. Thus molded discs were sintered at 1200° to 1500° C. for 2 hours in air atmosphere to obtain ceramics. The obtained ceramic discs were cut into discs having the diameter of 5 mm and the thickness of 2 mm. These discs were measured the dielectric constant ($\epsilon$), unloaded Q value ($Q_u$) and temperature stability for resonant frequency ($\tau_f$) by the above-mentioned method and the results are shown in Table 1.

TABLE 1

| Sample No. | Composition (Mole Fraction) | | | | $\epsilon$ | Qu | $\tau_f$ (ppm/°C.) |
|---|---|---|---|---|---|---|---|
| | x | y | z | w | | | |
| 1 | 0.762 | 0.048 | 0.19 | 0.6 | 37 | 3990 | 5 |
| 2 | 0.696 | 0.13 | 0.174 | 0.6 | 39 | 3840 | 11 |
| 3 | 0.667 | 0.083 | 0.25 | 0.6 | 40 | 4250 | 8 |
| 4 | 0.64 | 0.04 | 0.32 | 0.6 | 36 | 3820 | −5 |
| 5 | 0.593 | 0.111 | 0.296 | 0.6 | 36 | 2710 | 10 |
| 6 | 0.82 | 0.03 | 0.15 | 0.6 | unmeasurable because of poor sinter | | |
| 7 | 0.50 | 0.15 | 0.35 | 0.6 | | | |
| 8 | 0.67 | 0.08 | 0.25 | 0.1 | 39 | 3870 | 35 |
| 9 | 0.67 | 0.08 | 0.25 | 0.5 | 39 | 4210 | −5 |
| 10 | 0.67 | 0.08 | 0.25 | 0.9 | 40 | 3110 | −5 |
| 11 | 0.67 | 0.08 | 0.25 | 0.95 | 37 | 2660 | −43 |
| 12 | 0.67 | 0.08 | 0.25 | 0 | 35 | 2130 | −130 |

EXAMPLE 2

Starting materials of $BaCO_3$, $Na_2CO_3$, $Nb_2O_5$, $CaCO_3$ and $ZrO_2$ were weighed according to the composition of $[(1-w) (xBaO.yNa_2O.zNb_2O_5)+wCaO.ZrO_2]$. The mixtures of the starting materials were made into ceramics specimens in the same manner as in the Example 1. The dielectric characteristics of thus obtained dielectric ceramics are shown in Table 2.

TABLE 2

| Sample No. | Composition (Mole Fraction) | | | | $\epsilon$ | Qu | $\tau_f$ (ppm/°C.) |
|---|---|---|---|---|---|---|---|
| | x | y | z | w | | | |
| 1 | 0.762 | 0.048 | 0.19 | 0.7 | 30 | 4130 | 18 |
| 2 | 0.696 | 0.13 | 0.174 | 0.7 | 34 | 4300 | 5 |

TABLE 2-continued

| Sample No. | Composition (Mole Fraction) | | | | ε | Qu | τf (ppm/°C.) |
|---|---|---|---|---|---|---|---|
| | x | y | z | w | | | |
| 3 | 0.667 | 0.083 | 0.25 | 0.6 | 37 | 4470 | 5 |
| 4 | 0.64 | 0.04 | 0.32 | 0.6 | 35 | 4290 | 20 |
| 5 | 0.593 | 0.111 | 0.296 | 0.7 | 34 | 4060 | 15 |
| 6 | 0.82 | 0.03 | 0.15 | 0.6 | Unmeasurable because of poor sinter | | |
| 7 | 0.50 | 0.15 | 0.35 | 0.6 | | | |
| 8 | 0.67 | 0.08 | 0.25 | 0.1 | 38 | 3920 | 63 |
| 9 | 0.67 | 0.08 | 0.25 | 0.5 | 36 | 4270 | 8 |
| 10 | 0.67 | 0.08 | 0.25 | 0.9 | 32 | 3830 | −10 |
| 11 | 0.67 | 0.08 | 0.25 | 0.95 | 28 | 2930 | −15 |
| 12 | 0.67 | 0.08 | 0.25 | 0 | 27 | 1820 | −55 |

As seen from Tables 1 and 2, the ceramics obtained by the compositions within the scope of the present invention have dielectric constants between 28 to 40, unloaded Q values over 2700 and stability against temperature variations between +63 ppm/°C. and −43 ppm/°C.

Specimens No. 6 and 7 in Tables 1 and 2, which are outside the scope of the invention, were not strongly sintered. Therefore they can not be used for dielectric resonators. Specimens No. 12 in Tables 1 and 2, which are also out of the scope of the invention, exhibited unsatisfactory results.

What is claimed is:

1. A dielectric ceramic consisting essentially of a solid solution represented by the formula $$(1-w)(xBaO \cdot yNa_2O \cdot zNb_2O_5) + wMeO \cdot ZrO_2$$

wherein Me denotes Ca or Sr, $0.593 \leq x \leq 0.762$, $0.04 \leq y \leq 0.13$, $0.174 \leq z \leq 0.32$, $x+y+z=1$, and $0 < w \leq 0.95$ and having a dielectric constant from 28 to 40, Q value of 2700 to 4500 and a temperature coefficient of resonant frequency of +63 to −43 ppm/°C.

* * * * *